United States Patent [19]
Nestork

[11] 3,751,720
[45] Aug. 7, 1973

[54] RADIALLY ORIENTED MONOLITHIC CIRCUIT MASTERSLICE

[75] Inventor: William John Nestork, Wappingers Falls, N.Y.

[73] Assignee: International Business Machines Corporation, Armonk, N.Y.

[22] Filed: Dec. 20, 1971

[21] Appl. No.: 209,846

[52] U.S. Cl...... 317/234 R, 317/234 N, 317/235 R, 317/235 D, 317/101 A, 174/DIG. 3, 29/589
[51] Int. Cl............................. H01l 3/00, H01l 5/00
[58] Field of Search......................... 317/234, 4, 4.1, 317/5.3, 5.4, 27, 22, 101 A; 174/52 S, DIG. 3; 29/589

[56] References Cited

UNITED STATES PATENTS

| | | | |
|---|---|---|---|
| 2,668,184 | 2/1954 | Taylor et al. | 317/235 |
| 3,287,610 | 11/1966 | Reber | 317/234 N |
| 3,543,106 | 11/1970 | Kern | 317/234 G |
| 3,606,679 | 9/1971 | Schroeder | 317/234 N |
| 3,609,294 | 9/1971 | Cady | 317/234 N |

OTHER PUBLICATIONS

Technical Notes RCA by Balents; TN No. 857 Feb. 11, 1970, pages 1 and 2.

*Primary Examiner*—John W. Huckert
*Assistant Examiner*—Andrew J. James
*Attorney*—Kenneth R. Stevens et al.

[57] ABSTRACT

A semiconductor integrated circuit masterslice comprising semiconductor substrate having a center of origin and arcuate or annular conductive lines thereon. A plurality of cell groups are symmetrically located on the semiconductor substrate with respect to radial lines extending from the center of origin so as to significantly increase packing densities compared to that available with orthongonally or randomly disposed monolithic integrated circuit structures.

12 Claims, 6 Drawing Figures

PATENTED AUG 7 1973 3,751,720

RADIALLY ORIENTED MONOLITHIC CIRCUIT MASTERSLICE

BACKGROUND OF THE INVENTION

1. Field of the Invention

This invention relates to integrated circuits, and more particularly to topological interconnection arrangement of integrated circuit devices on a monolithic substrate.

2. Description of the Prior Art

Thus far, monolithic circuits have been constructed on silicon chips either by interconnecting randomly placed semiconductor devices or by interconnecting symmetrically placed integrated circuit cells, i.e., those located in orthogonal or X-Y coordinate planes. However, as circuit densities increase, the wirability of the prior art integrated circuit devices constitutes a critical problem. That is, despite the manufacturing capability of fabricating smaller and smaller integrated circuit devices, the maximum obtainable densities are limited by wirability constraints.

SUMMARY OF THE INVENTION

Accordingly, it is an object of the present invention to provide a monolithic substrate having increased device packing densities over prior art monolithic packing densities of comparable device size.

It is another object of the present invention to provide increased monolithic device packing densities over comparably sized prior art device packing densities with an attendant improvement in yield and device reliability.

In accordance with the aforementioned objects, the present invention comprises a monolithic semiconductor substrate having a plurality of arcuate conductive means disposed on the substrate for providing electrical connections to a plurality of cell groups disposed on the substrate in symmetrical relationship to radial lines extending from a center of origin. Additionally, a plurality of separated radial diffused regions extending around the perimeter of the monolithic semiconductor substrate provide additional wiring capabilities for the cell groups.

The foregoing and other objects, features and advantages of the invention will be apparent from the following more particular description of the preferred embodiment of the invention as illustrated in the accompanying drawings.

DESCRIPTION OF THE PREFERRED EMBODIMENTS

Figure 1:
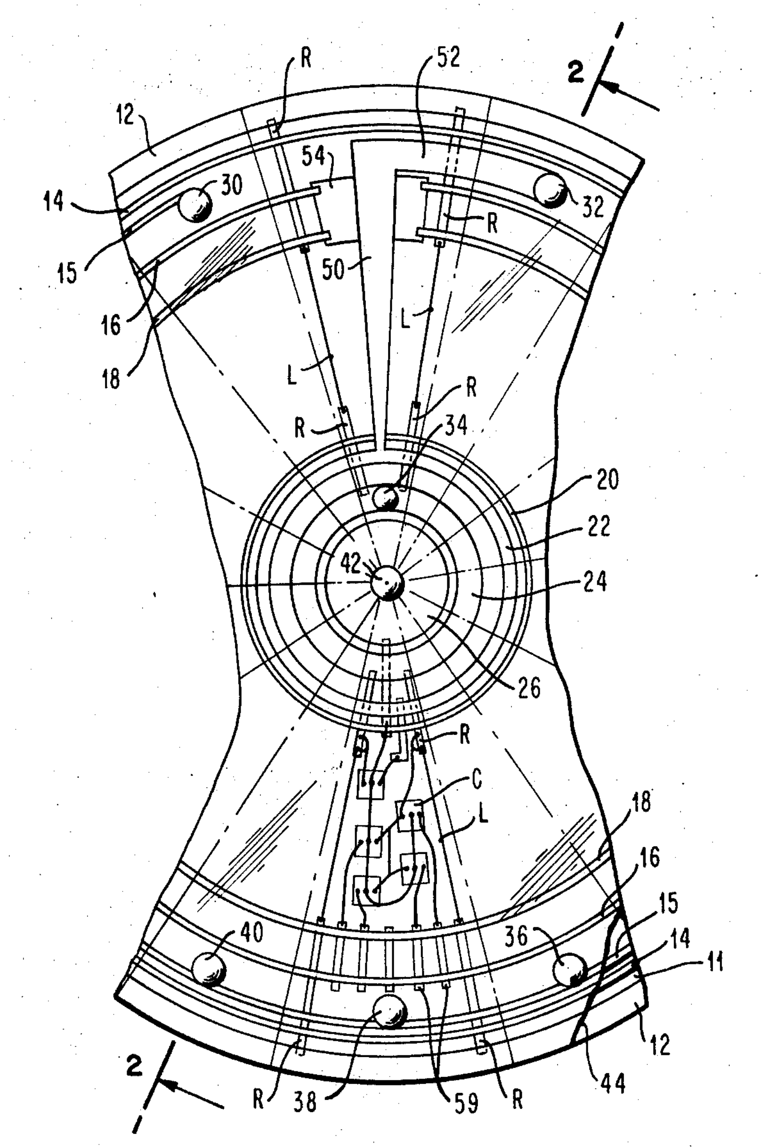
FIG. 1 shows a plan view illustrating the radial oriented topology of a plurality of semiconductor device cells located on a semiconductor substrate or masterslice.
Figure 2:
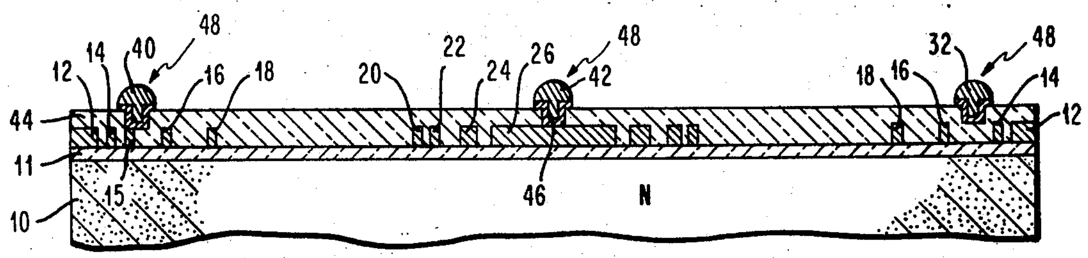
FIG. 2 is a cross-sectional view of FIG. 1 taking it along lines 2—2.

Now referring to FIGS. 1 and 2, the semiconductor substrate or monolithic masterslice comprises an N type epitaxial layer 10 and an overlying silicon oxide layer 11 in which are formed a plurality of active and passive semiconductor devices, and a plurality of concentric metallic power distribution paths. The upper surface is illustrated as being circular; however, the invention is equally adaptable to a circular topology disposed on a non-circular starting semiconductor substrate.

At the outer periphery of the epitaxial layer 10 there is disposed an annular metallic conductive path 12. Disposed inwardly towards the substrate semiconductor center of origin are a plurality of additional concentric conductive metallic rings comprising paths 14, 15, 16, 18, 20, 22 and 24. At the very center of the masterslice, there is located a circular metallic island 26.

In the preferred embodiment, the devices disposed on the masterslice 10 comprise current switch emitter-follower logic and therefore, require three separate sources of voltage. Accordingly, the conductive ring 12 provides a −V source of voltage, the conductive ring 22 a $V_{REF}$ source of voltage, and the concentric ring 24 a +V source of reference voltage.

The remaining annular concentric conductive paths 14, 15, 16, 18 and 20 are employed as wiring routes for the individual active and passive devices.

Access from the outside world to the plurality of concentric conductive paths is accomplished by a plurality of pads, some of which are shown at 30, 32, 34, 36, 38, 40 and 42.

Any suitable metallurgy can be employed to electrically contact the underlying metallurgical conductive paths through an overlying passivation layer 44, such as sputtered quartz by conventional etching and terminal metallurgy deposition. For example, selective etching forms openings in the passivation layer 44 to the desired conductive rings. Then, suitable contact metallurgy comprising layers of chrome, copper and gold provide intimate electrical contact to the conductive rings, as generally depicted at 46. Next, a lead tin solder ball generally shown at 48 is deposited to complete the plurality of land terminals.

In the preferred embodiment, the conductive metal ring 22 is accessed to pad 32 via a metal extension comprising a radial portion 50 and an arcuate portion 52. Conductive line 50 and conductive lines 16 and 18 are situated at the same level and would normally intersect and short-circuit. Therefore, a diffused N+ underpass region 54 is formed in the epitaxial region 10, but electrically insulated from line 50 by oxide layer 11, in order to electrically connect the conductive metallic rings 16 and 18 at this juncture.

A plurality of semiconductor integrated circuit cell groups generally depicted in FIG. 1 at C, in conjunction with a plurality of diffused resistors R, and a plurality of radially disposed N+ diffused regions generally designated at 59, coupled with a plurality of conductive lines L complete the structure for the masterslice. The detailed monolithic implementation for the plurality of cells C, the radially disposed resistor regions R, the N+ connector regions 59, and the plurality of interconnection metallurgical lines L are shown in more detail in FIGS. 3 through 6.

Figure 3:
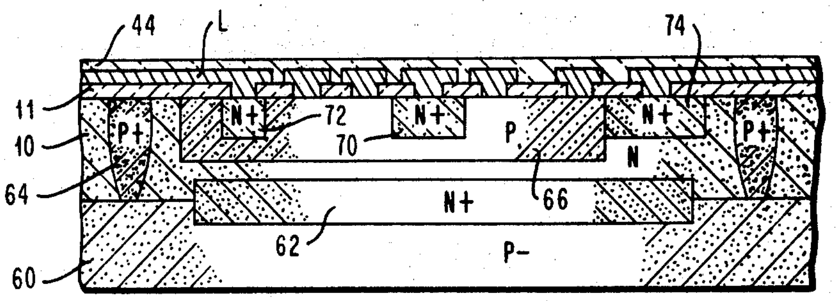
FIGS. 3 through 6 are cross-sectional views illustrating distinct semiconductor devices disposed on the masterslice of FIG. 1.

FIG. 3 illustrates the monolithic implementation of one of the cells generally depicted in FIG. 1 at C. Like reference numerals are employed to indicate like elements as those disclosed and described in FIGS. 1 and 2.

The particular monolithic integrated circuit active and passive devices illustrated in FIGS. 3 through 6 do not per se form part of the present invention, but merely illustrate the ease with which monolithic devices are integratable into the radially oriented masterslice of the present invention. FIG. 3 illustrates an integrated circuit clamp and comprises a P– starting substrate 60 and the overlying epitaxial region 10 which corresponds to that previously illustrated in FIGS. 1 and 2. An N+ subcollector region 62 is located between a P+ isolation region 64. A P type base region 66 is formed or located within the epitaxial region 10. A pair of N+ diffused regions 70 and 72 constitute emitter regions for the particular circuit implementation described in the preferred embodiment. An N+ region 74 tailors the collector resistance to the integrated circuit clamp transistor comprising the N+ emitter region 70 and the P base region 66. As previously shown, a plurality of contact openings are formed in the silicon oxide passivation layer 11 in order to provide contact metallurgy to the desired active and passive device regions in the overall integrated circuit clamp. The sputtered quartz layer 44 provides protection for the upper surface metallurgy previously depicted at L in FIG. 1.

Figure 4:
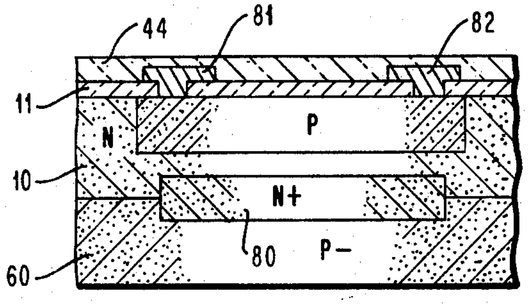

FIG. 4 illustrates the monolithic implementation of the resistors designated generally in FIG. 1 as R. The monolithic substrate comprises the P– substrate 60 and the N epitaxial region 10. An N+ subcollector region 80 also constitutes a portion of this P type resistor. The silicon oxide layer 11 in conjunction with a pair of metallurgical resistor contacts 81 and 82 and the sputtered quartz passivation layer 44 complete the monolithic resistor device.

Figure 5:
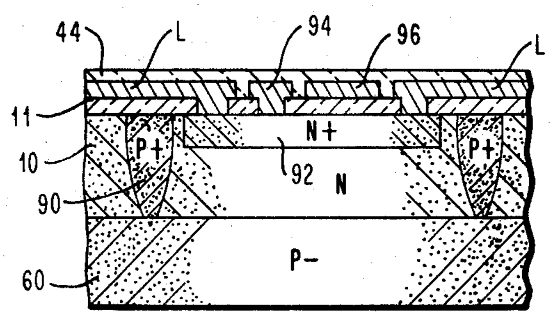

FIG. 5 illustrates the monolithic implementation of an N+ type connector element 92, also depicted generally at 59 in FIG. 1. Again, the semiconductor substrate comprises the P– layer 60 and the N type epitaxial region 10 in which is formed a P+ isolation region 90. A pair of metallized contacts 94 and 96 formed through the silicon oxide layer 11 and the quartz passivation 44 are suitable for contacting the concentric rings such as 16 and 18. Similarly, the pair of metallurgical interconnections L are used to connect to other active and passive device terminals on the masterslice.

Figure 6:
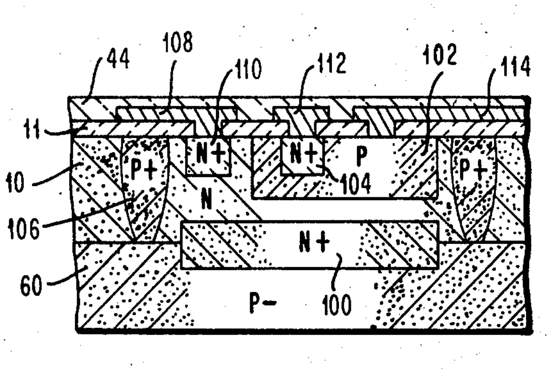

FIG. 6 is a schematic representation of a current switch transistor device suitable for monolithic incorporation as one of the cells generally depicted at C in FIG. 1 and which can be compatibly combined with the integrated circuit clamp depicted in FIG. 3. The current switch transistor is formed within the monolithic substrate comprising the P– layer 60 and the N epitaxial region 10. The device comprises an N+ subcollector region 100, a P base region 102, and an N+ emitter region 104. A P+ diffused region 106 provides electrical isolation for the transistor device. A collector contact 108 is connected to the collector region via a low resistivity N+ region 110. Also, an emitter contact 112 and a base contact 114 make electrical contact through the silicon oxide region 11 and the sputtered quartz passivation layer 44 to their respective emitter and base regions.

The particular monolithic implementation of active and passive devices as illustrated in FIGS. 3 through 6 are merely representative of current switch emitter-follower type circuits which are advantageously suitable for implementation into the radially oriented monolithic circuit masterslice, but it is to be understood that other types of logic circuits can also be advantageously incorporated into this radial and arcuate interconnection scheme so as to provide higher packing densities, greater yield and reliability.

The active and passive devices on the masterslice are schematically depicted as rectangular type shapes. However, even higher packing densities are obtainable by fabricating the transistors, resistors, and underpass diffused connector regions with sectorial shapes. Thus, the device shapes are more advantageously situable at various sector locations.

Although the invention has been particularly shown and described with reference to the preferred embodiments thereof, it will be understood by those skilled in the art that the foregoing and other changes in form and details may be made therein without departing from the spirit and scope of the invention.

What is claimed is:

1. A semiconductor integrated circuit masterslice comprising:

a. a semiconductor substrate having a center of origin, b. a plurality of annular conductive line means disposed over the surface of said semiconductor substrate, c. a plurality of sector cells having active and passive devices for performing independent logic functions disposed in said substrate around said center of origin, and d. means for connecting said plurality of sector cells to said plurality of annular conductive line means.

2. A semiconductor integrated circuit masterslice as in claim 1 wherein:

a. said plurality of annular conductive line means comprise a plurality of separated concentric annular lines extending outwardly from said center of origin.

3. A semiconductor integrated circuit masterslice as in claim 2 wherein:

a. said plurality of separated concentric annular lines comprise a plurality of arcuate metal rings.

4. A semiconductor integrated circuit masterslice as in claim 2 further including:

a. subsurface connection means located below said semiconductor substrate surface and interconnecting at least some of said annular conductive line means.

5. A semiconductor integrated circuit masterslice as in claim 4 further including:

a. additional interconnection metallurgy disposed at the same level as said plurality of separated concentric annular lines and extending in an intersecting direction thereto, and b. said subsurface connection means comprising a low resistivity underpass semiconductor region located in said semiconductor substrate for providing a bypass connection between at least one of said plurality of annular conductive line means and said additional interconnection metallurgy.

6. A semiconductor integrated circuit masterslice as in claim 4 further including:

a. a plurality of separated radially disposed first semiconductor regions located in said substrate for providing interconnection paths between said plurality of cells.

7. A semiconductor integrated circuit masterslice as in claim 6 wherein:

a. said active devices comprise an emitter region, and b. said first semiconductor regions comprise a semiconductor doped material corresponding to said emitter regions.

8. A semiconductor integrated circuit masterslice as in claim 1 further including:

a. a plurality of separated second semiconductor regions, said second semiconductor regions comprising suitable doping levels for forming integrated circuit resistor passive devices and being adapted for interconnection to said active devices.

9. A semiconductor integrated circuit masterslice as in claim 8 wherein:

a. said plurality of cells are sectorially shaped.

10. A semiconductor integrated circuit masterslice as in claim 6 wherein:

a. said first first semiconductor regions are disposed around the perimeter of said masterslice and are adapted for interconnection to at least some of said annular conductive line means.

11. A semiconductor integrated circuit masterslice as in claim 8 wherein:

a. said second semiconductor regions are sectorially shaped.

12. A semiconductor integrated circuit masterslice as in claim 10 wherein:

a. said first semiconductor regions are sectorially shaped.

* * * * *